United States Patent
Daoud (10) Patent No.: US 6,319,024 B1
(45) Date of Patent: Nov. 20, 2001

(54) STRAIN RELIEF MECHANISM FOR A PLUG-IN PROTECTOR PANEL

(75) Inventor: Bassel Hage Daoud, Parsippany, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/328,558

(22) Filed: Jun. 9, 1999

(51) Int. Cl.[7] .............................. H01R 12/00; H05K 1/00
(52) U.S. Cl. ............................................... 439/82; 439/346
(58) Field of Search .................................. 439/54, 55, 82, 439/346, 353, 357; 174/260, 261, 262, 263, 264, 265, 266, 267; 361/119, 331, 357

(56) References Cited

U.S. PATENT DOCUMENTS

| | | | |
|---|---|---|---|
| 3,008,112 | * 11/1961 | Swengel | 439/55 |
| 3,947,729 | 3/1976 | Tesch | 317/61.5 |
| 4,179,170 | * 12/1979 | Splitt et al. | 439/107 |
| 4,470,649 | * 9/1984 | Spencer et al. | 339/17 |
| 4,793,817 | * 12/1988 | Hiesbock | 439/82 |
| 4,796,150 | 1/1989 | Dickey et al. | 361/119 |
| 5,175,662 | * 12/1992 | DeBalko et al. | 361/119 |
| 5,362,244 | * 11/1994 | Hanson et al. | 439/82 |
| 5,509,814 | * 4/1996 | Mosquera | 439/82 |
| 5,667,412 | * 9/1997 | Takahashi et al. | 439/751 |
| 5,812,378 | * 9/1998 | Fjelstad et al. | 361/769 |
| 5,919,051 | * 7/1999 | Mitra | 439/74 |

OTHER PUBLICATIONS

U.S. application No. 09/328,642, Bassel Hage Daoud, filed Jun. 9, 1999.

* cited by examiner

Primary Examiner—Tulsidas Patel
Assistant Examiner—Brian S. Webb
(74) Attorney, Agent, or Firm—Duane, Morris & Heckscher LLP (57) ABSTRACT

A protector panel receives plug-in protector modules. The panel has a plurality of pin receiving holes. The panel has a plurality of members depending from its bottom. Each of the at pin receiving holes has a respective pair of the depending members adjacent to and on opposite sides of that hole. Each member has a boss at an end of the member. A printed wiring board is attached to the panel, beneath the depending members. The printed wiring board has wirings on its surface. The printed wiring board has a plurality of holes, each aligned with a respective pin receiving hole of the panel. The printed wiring board has a resilient elongated member adjacent to each hole of the printed wiring board. The elongated members have a conductive material on them. The conductive material forms an electrical connection between the wirings and pins of the plug-in protection devices, while the pins are at least partially inserted into the holes of the panel.

17 Claims, 6 Drawing Sheets

STRAIN RELIEF MECHANISM FOR A PLUG-IN PROTECTOR PANEL

FIELD OF THE INVENTION

The present invention relates to protector panels for telecommunications equipment.

DESCRIPTION OF THE RELATED ART

A protector panel containing a plurality of plug-in protectors may be installed in a telephone central office or other location. The plug-in protectors protect telecommunications equipment against sneak currents and voltage surges.

Figure 7A:
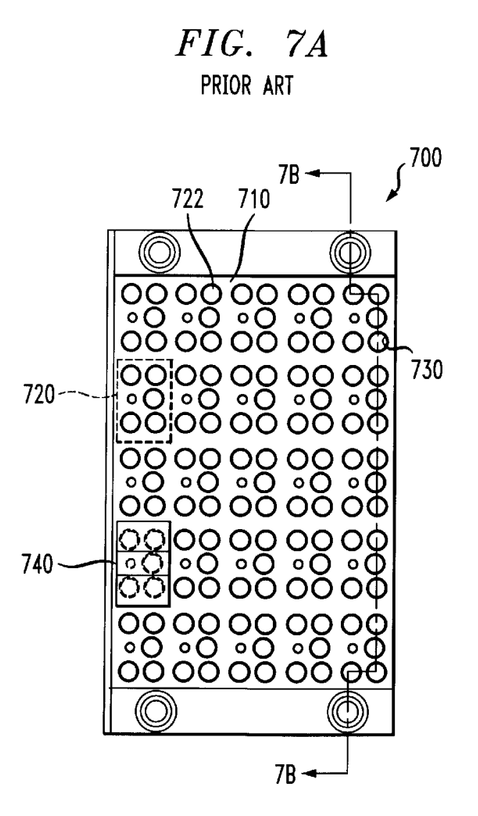
FIG. 7A is a top plan view of a conventional protector panel.
Figure 7B:
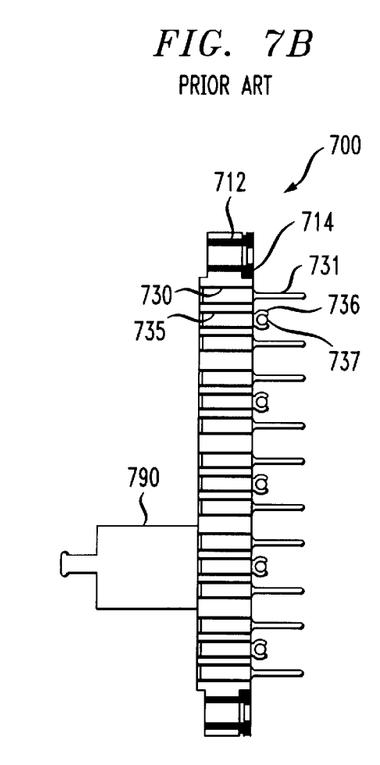
FIG. 7B is a cross-sectional view of the conventional protector panel of FIG. 7A, taken along section line 7B—7B of FIG. 7A.
Figure 7C:
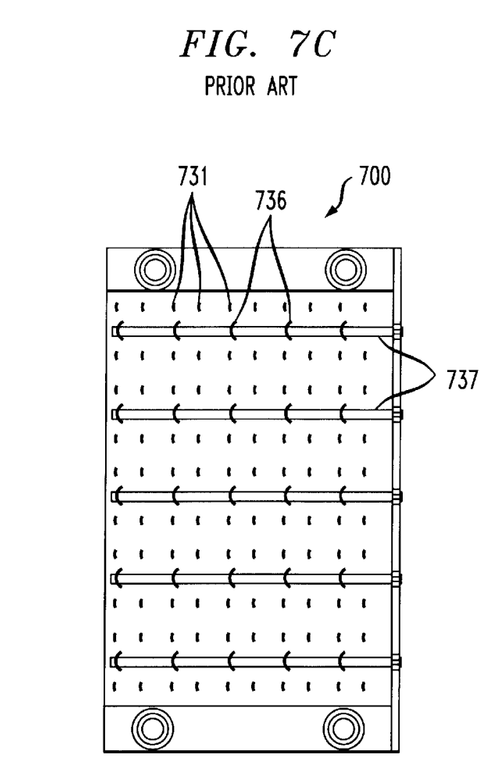
FIG. 7C is a bottom plan view of the conventional protector panel of FIG. 7A.

FIGS. 7A–7C show a conventional design for a protector panel 700. The protector panel 700 includes a substrate 710 having a plurality of holes 722 organized in clusters 720, each cluster accommodating a plug-in protector 790. Each hole has a respective conductive socket 730 installed in it. The sockets 730 are typically gold-plated and are quite expensive. The sockets are individually installed in the holes 722. This installation is labor intensive and expensive.

A plug-in protector 790 can be plugged into each cluster 720 of sockets 730. Typically, a plug-in protector is 790 installed in one of two positions. In a partially inserted position (not shown), the plug-in protector 790 forms the necessary connections to protect incoming wires from voltage surges and sneak currents, but the customer's service is disconnected. In the fully inserted position (shown in FIG. 7B), the plug-in protector 790 protects the incoming wires and also provides connectivity to connect the customer's telephone lines. The sockets 730 must be able to grip the pins of the plug-in protector 790 while the protector is inserted or pulled out To ensure that the sockets 730 (and the protectors) do not fall out, they are wedged into the panel substrate 710 tightly. It is essential that the protectors do not fall out; otherwise there would be no protection.

A plurality of grounding conductors 737 connect the ground lead 736 of each socket cluster 720 to a ground strip 714 on the side of the panel 700. Each socket 730 has a wire wrap terminal 731 projecting from the bottom side of the panel 700. Incoming wires (not shown) are individually wrapped around the wire wrap terminals 731. This is labor intensive, and is thus an expensive process.

A simpler protector panel that can be fabricated with less labor is desired.

SUMMARY OF THE INVENTION

The present invention is a panel that receives plug-in modules. The panel has at least one pin receiving hole. The panel has a plurality of members depending therefrom. Each of the at least one pin receiving hole has a respective pair of the members adjacent to and on respectively different sides of that hole. Each member has a boss at an end of the member.

DETAILED DESCRIPTION

Figure 1:
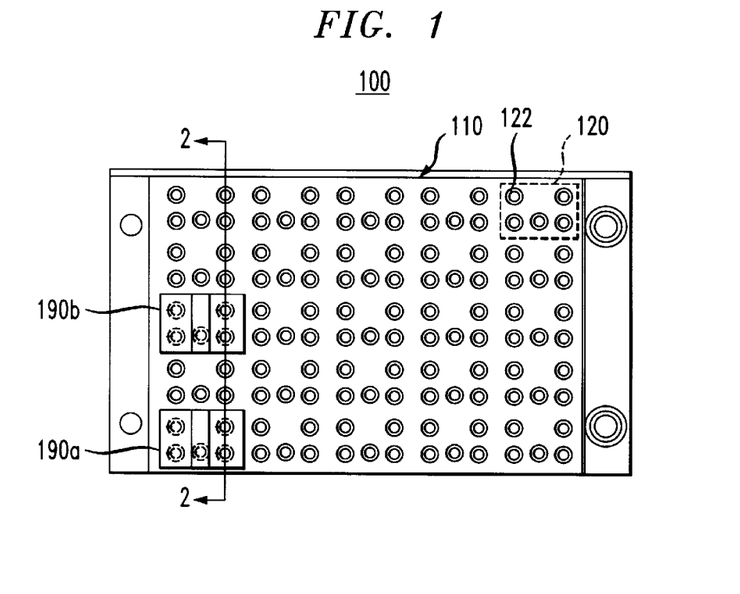
FIG. 1 is a top plan view of an exemplary protector panel according to the invention.

FIG. 1 shows an exemplary protector panel 100. The panel 100 receives plug-in modules, such as modules 190a and 190b. The panel 100 has at least one pin receiving hole (preferably a plurality of holes) 122. In the example, the pin-receiving holes 122 are organized in clusters 120, each cluster accommodating a respective plug-in protector module 190a, 190b. In the exemplary embodiment, the holes 122 guide the pins 191 of the plug-in protect modules 190a and 190b, but need not contain conductive sockets.

Figure 2:
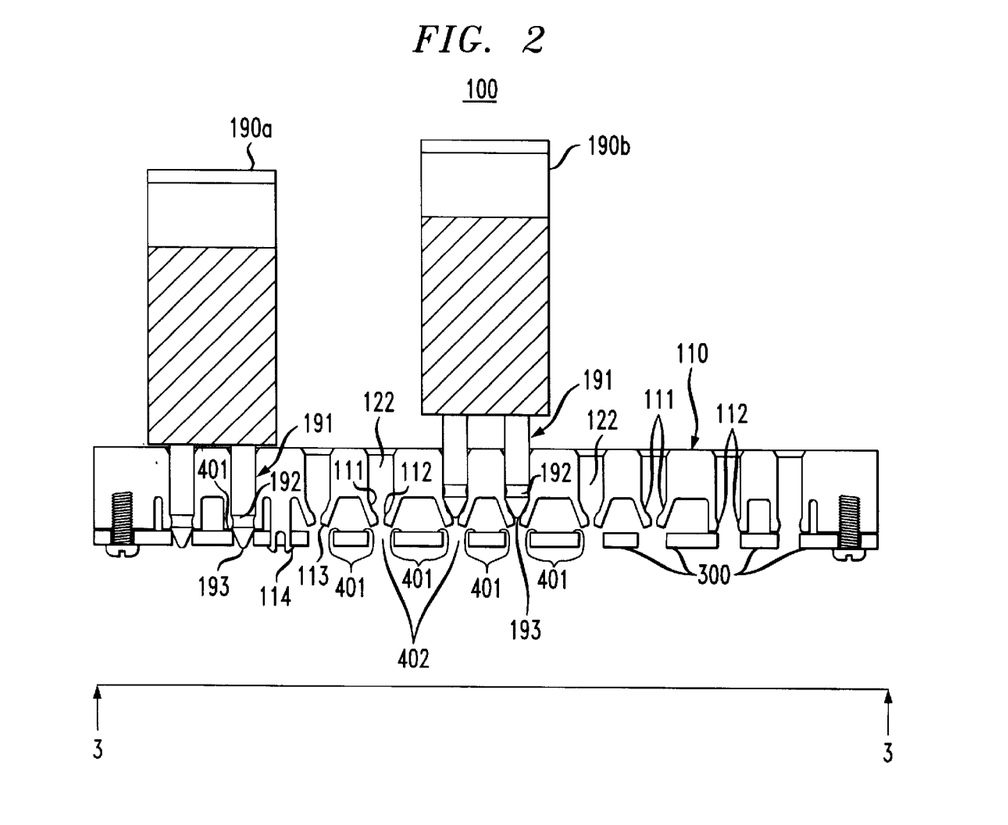
FIG. 2 is a cross sectional view of the protector panel of FIG. 1, taken along section line 2—2 of FIG. 1.

FIG. 2 is a cross sectional view of the panel 100. The inside of plug-in protectors 190a and 190b is shown by hatched lines. One of ordinary skill in the art understands that the details of the plug-in protector have been omitted from FIG. 2 for simplicity. An exemplary interior design for a plug-in protector is shown in U.S. Pat. No. 4,796,150 to Dickey et al., which is incorporated by reference herein in its entirety.

The panel 100 has a substrate 110 that is formed of a strong and resilient material, such as polycarbonate or the like. The panel 100 has a plurality of members 111 depending from the bottom of the substrate 110. Each of the pin receiving holes 122 has a respective pair of members 111 adjacent to it and on opposite sides of the hole 122. Each member 111 has a boss 112 at its end.

Each member 111 has a rest position in which the member 111 is bent towards a center of the pin receiving hole 122. For example, the members 111 beneath the pins 191 of plug-in protector 190b are shown in the rest position.

Each member 111 also has a gripping position in which the member is deflected away from the center of the pin receiving hole 122 to accommodate and grip a pin 191 that is completely inserted in that pin receiving hole. For example, the members 111 in the holes 122 that receive the pins 191 of plug-in protector 190a are in the gripping position. In the gripping position, the members 111 are approximately parallel to a longitudinal axis of the pin receiving hole 122. Once the plug-in protectors are fully seated on the protector panel face, the members 111 firmly hold the protectors in place. The bosses 112 fit into the groove 192 of each pin 191. The members 111 provide enough resistance to spreading further, so that they grip the pin 191. The members 111 also grip the groove 192 with sufficient force so that a positive force is required to pull the pin 191 out of the hole 122. This provides considerable strain relief to hold the protector 190a, 190b in place.

The respective pair of members 111 corresponding to each pin receiving hole 122 are positioned on opposite sides of that pin receiving hole 122. The boss 112 of each member 111 is received by the groove 192 when the pin 191 is inserted in one of the pin receiving holes 122.

The boss 112 of each member 111 preferably has a profile that is a smooth curve. This profile may be, for example, a portion of a circle, ellipse, parabola, or hyperbola. Other shapes may alternatively be used. For example, the profile of the boss 112 may be a wedge or tooth shape.

In the exemplary embodiment, when the members 111 are in the gripping position, the end 113 of each member contacts the printed wiring board 300. Thus, the members 111 act both as gripping members, and as spacers for the printed wiring board. Alternatively, the members 11 may be shorter, and separate spacers may be used to maintain the spacing between the substrate 110 of protector panel 100 and the printed wiring board 300.

Exemplary substrate 110 has two hanging members approximately 180 degrees apart adjacent to each pin receiving hole 122. Alternatively, any number of hanging members greater than one may be used. Preferably (although not necessarily), the members 111 are evenly spaced. For example, three members spaced 120 degrees apart may be used.

The substrate 110 of the protector panel 100 may be molded using a conventional process.

As shown by the plug-in protector 190b in FIG. 2, the pins 191 of the plug-in protector can be supported above the bosses 112 of the members 111 of a plurality of holes 122 in the panel 110, while the members are in the rest position. Thus, if a technician wishes to partially withdraw the plug-in protector 190b from the panel as shown in FIG. 2, the members 111 are sufficiently stiff so that protector 190b does not re-insert itself by the force of its own weight (One of ordinary skill understands that, if the panel is mounted vertically, the protector would be oriented horizontally, and would not re-insert itself by the force of its weight in any event.)

The exemplary pin 191 has a straight cylindrical surface, with a groove 192 and an approximately conical tip 193 at its end. Other tip shapes may be used, such as, for example, a paraboloid, hyperboloid, hemisphere, or partial ellipsoid. The shape of the tip 193 guides the pin 191 and accommodates any slight misalignment between the protector panel 110 and the printed wiring board 300.

Another feature of the exemplary embodiment is the use of pins having a uniform length. The plug-in protectors 190a, 190b may optionally have a plurality of pins 191 of substantially the same length, so as to each electrically contact the printed wiring 410 simultaneously while the pins 191 are inserted in the pin receiving holes 402. This feature takes advantage of the current ability to discontinue a customer's service using the central switch, instead of physically partially withdrawing the plug-in protector associated with that customer. By using an external switching mechanism, the protector 190b could remain completely inserted, even when service is discontinued. All five of the pins 191 have grooves 192 that are gripped by the hanging members 111 of the panel substrate 110. Because all five of the pins in the exemplary embodiment can have a common length, the exemplary embodiment can provide approximately 66% more strain relief than an otherwise similar system that only has three full length pins in each plug-in protector.

In contrast, in the prior art plug-in protectors 790, such as the 7CB protector manufactured by Lucent Technologies, Inc. of Murray Hill, N.J., two of the five pins of the protector are shorter than the remaining three pins. The shorter pins would not have the strain relief provided by the exemplary embodiment.

As noted above, the exemplary holes 122 serve as guides for the pins 191, and do not require conductive sockets to form an electrical connection. Conventional sockets with wire wrap terminals could be inserted in the holes 122. However, in the exemplary embodiment, a printed wiring board interface is used instead. The printed wiring board eliminates the need to individually connect each wire wrap terminal, thus eliminating a labor intensive step of the fabrication process.

If a printed wiring board is to be used to route the wirings, any known method for forming a connection to a printed wiring board may be used. For example, the printed wiring board may have a plurality of plated through holes or conductive eyelets beneath each pin 191, so that the pins 191 can contact the plated through holes or eyelets. In the exemplary embodiment, however, an alternative connection method and structure are used, as described below.

Figure 3:
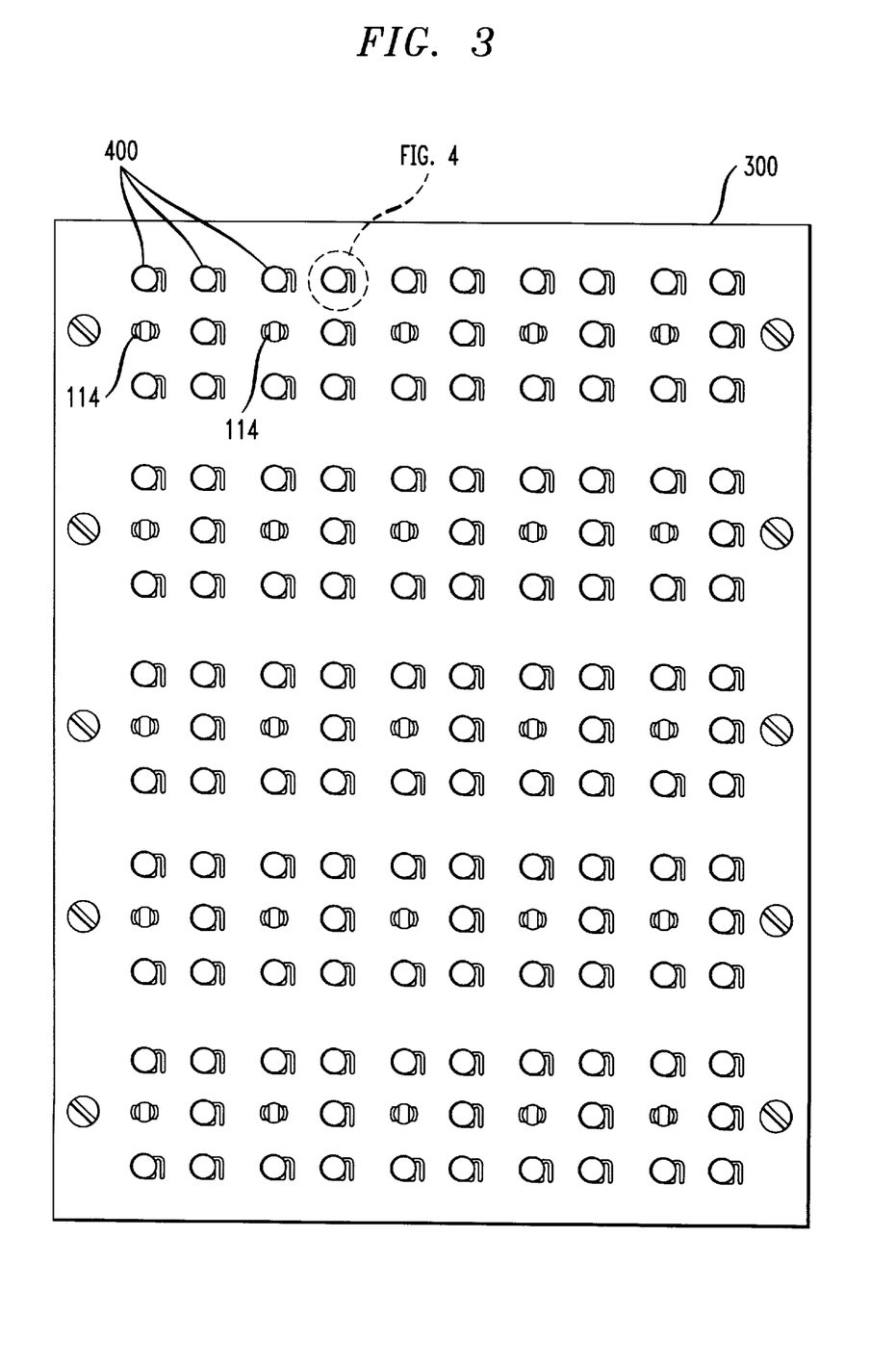
FIG. 3 is a bottom plan view of the protector panel shown in FIG. 2, viewed from section line 3—3 of FIG. 2.
Figure 4:
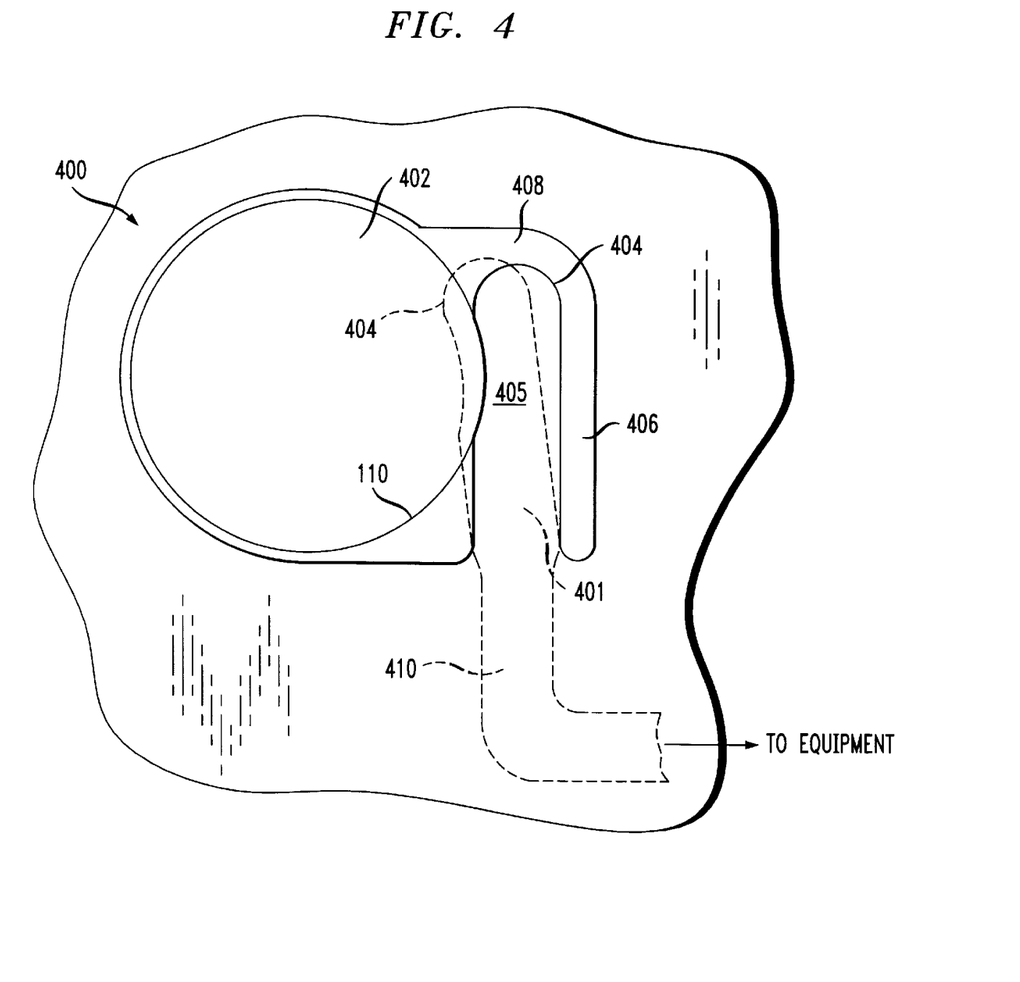
FIG. 4 is an enlarged detail of a feature of the printed wiring board of FIG. 3.

FIG. 3 is a bottom plan view of the protector panel 100. A printed wiring board 300 may be mounted to the bottom of the protector panel 100, beneath the plurality of members 111. Printed wiring board 300 may be held in place by conventional fasteners, such as latches 114. Other known fasteners may also be used. Rather than individually wrapping wires around terminals, connections are made to all wirings 410 (FIG. 4) of the printed wiring board 300 simultaneously, when the board 300 is fastened to the bottom of the panel 100. The printed wiring board has printed wirings 410 (FIG. 4). The printed wiring 410 has contacts 400 aligned with the plurality of pin receiving holes 122, for forming electrical connections to the pins 191 of the plug-in protectors 190a, 190b.

FIG. 4 shows an exemplary contact 400. Each contact 400 has a resilient elongated member (such as a contact finger 404) adjacent to the hole 122. Each elongated member 404 is aligned with a respective pin receiving hole 122, so as to contact a respective pin 191 when that pin is inserted in that pin receiving hole. The elongated member 404 has a conductive material 401 on its surface 405. The elongated member 404 is shaped and positioned so that the tip 193 of the pin 191 of a plug-in protector 190a engages and deflects the elongated member when the pin 191 is fully inserted, ensuring sufficient contact to create an electrical connection. The conductive material conducts current between the wiring 410 and a pin 191 or electrode while the pin or electrode is inserted into the hole 122. Thus, an electrical connection is formed between the wiring 410 and a pin 191 or electrode inserted in one of the pin receiving holes 122 while the pin 191 is inserted, and the members 111 adjacent to the pin 191 are in the gripping position.

Further, the design of the elongated member 404 is such that the member deflects elastically, without creep. When the pin 191 is removed, the member 404 returns to its rest position (shown in phantom in FIG. 4). This ensures that there is sufficient force to maintain electrical contact when a pin 191 is subsequently returned to the hole 402 adjacent to that member 404. The amount of deflection shown in FIG. 4 is exaggerated for ease of visibility. As little as 0.13 to 0.18 millimeters (0.005 to 0.007 inches) of maximum deflection is sufficient to ensure good electrical contact. The printed wiring board 300 may be formed using any conventional resilient substrate material used for a printed wiring board.

Each pin 191 in the example has an approximately conical tip 193 with a groove 192 adjacent to the tip. The tip 193 contacts the conductive material 401 of the elongated member 404. The boss 112 of the hanging member 111 of the panel substrate 110 is received by the groove 192, when the pin 191 is inserted in one of the pin receiving holes 122.

In the exemplary embodiment of FIGS. 3 and 4, a contact finger 404 is formed by machining a channel or slot 406 adjacent to a respective hole 402 in the printed wiring board 400. The hole 402 is aligned with the hole 122 of the panel substrate 110, as best seen in FIG. 2.

Each contact finger 404 is plated with a conductive material 401, which may be, solder, for example. Material 401 may be deposited on the printed wiring board 300 by a conventional masking and deposition process. Alternatively, a layer of the conductive material 401 may be deposited over the printed wiring board, and a conventional selective etching process may be used to remove the material 401 where it is not needed.

The elongated member 404 is a finger-shaped, cantilevered member. The printed wiring board 300 has a first slot 406 adjacent to the elongated member 404, allowing the elongated member 404 to deflect elastically when the pin 191 or electrode is inserted into the hole 402.

In FIG. 4, the relaxed (rest) position of the elongated member 404 (when no pin is inserted in the hole 402) is shown in phantom. The diameter of hole 402 and the rest position of elongated member 404 are selected so that member 404 deflects from the position shown in phantom to the position shown by solid lines when a pin 191 is completely inserted in the corresponding hole 122.

An exemplary method for forming the printed wiring board 300 includes forming the printed wiring board with a plurality of wirings 410. A plurality of holes 402 are formed in the printed wiring board 300. Each hole 402 has a conductive material 401 on the surface 405 of the printed wiring board 300 adjacent thereto. A first slot 406 is machined adjacent to each of the plurality of holes 402, to form a resilient elongated member 404 having conductive material thereon. An exemplary machine method may be forming the slot 406 using a milling machine. A connecting portion 408 may be machined between the first slot 406 and the hole 402, so that the resilient elongated member 404 is cantilevered, as shown in FIG. 4.

The printed wiring board 300 is attached to a protector panel 110 (or the protector panel is attached to the printed wiring board). The pin receiving holes 122 of the protector panel 110 are aligned with respective ones of the plurality of holes 402 of the printed wiring board 300, so that a pin 191 inserted through the pin receiving hole 122 contacts the resilient elongated member 404 of the board 300. Once the panel 110 and wiring board 300 are aligned and attached together, a plurality of plug-in protectors 190a, 190b can then be inserted in the plurality of pin receiving holes 122 of the protector panel 110.

Figure 5A:
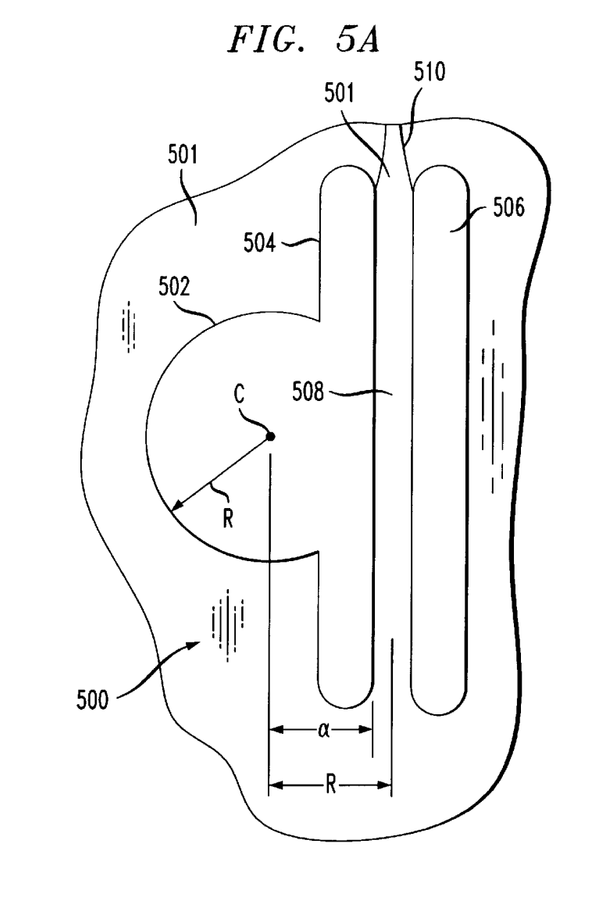
FIG. 5A is an enlarged detail of an alternative conductive pad that may be used in a variation of the exemplary embodiment.
Figure 5B:
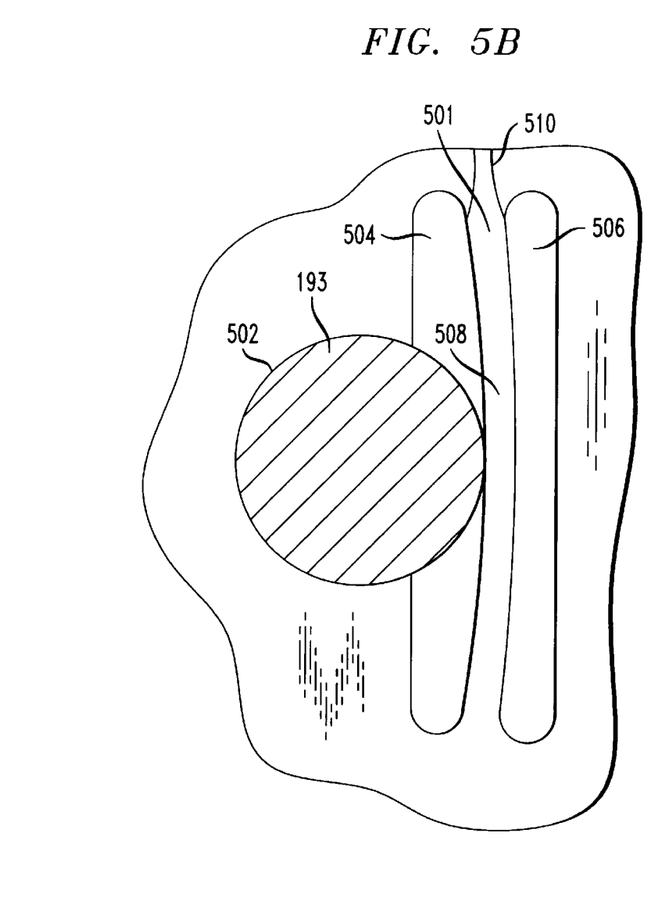
FIG. 5B shows a pin of a plug-in protector making electrical contact with the pad of FIG. 5A.

FIGS. 5A and 5B show a second exemplary connection 500 that may be used on the printed wiring board. The printed wiring board 300 has a plurality of holes 502. A resilient elongated member 508 is adjacent to each hole 502. In this example, the elongated member 508 is fixed at both ends, and is not cantilevered. More specifically, in this example, the elongated member 508 is formed between two slots 504 and 506. The first slot 504 is connected to the hole 502. A second slot 506 is on a side of the hole 502 opposite the first slot 504. The minimum distance a between the center C of the hole and the edge of the member 508 is less than the radius R of the hole 502. The first slot 504 is adjacent to the elongated member 508, and the second slot 506 is separated from the center C of the hole 502 by a distance greater than the radius R, forming the elongated member 508 between the slots.

The elongated member 508 has a conductive material 501 on it. The conductive material 501 forms an electrical connection between the wiring 510 and a pin 191 or electrode while the pin 191 or electrode is at least partially inserted into the hole 502. The elongated member 508 deflects when the pin 191 or electrode is inserted into the hole 502.

FIG. 5B shows deflection of the elongated member 508 when the tip 193 of pin 191 is inserted in the hole 502. As in the example of FIG. 4, the elongated member 508 of FIG. 5B deflects elastically, without creep, and is capable of returning to its rest position (FIG. 5A) if the pin 191 is removed.

Figure 6A:
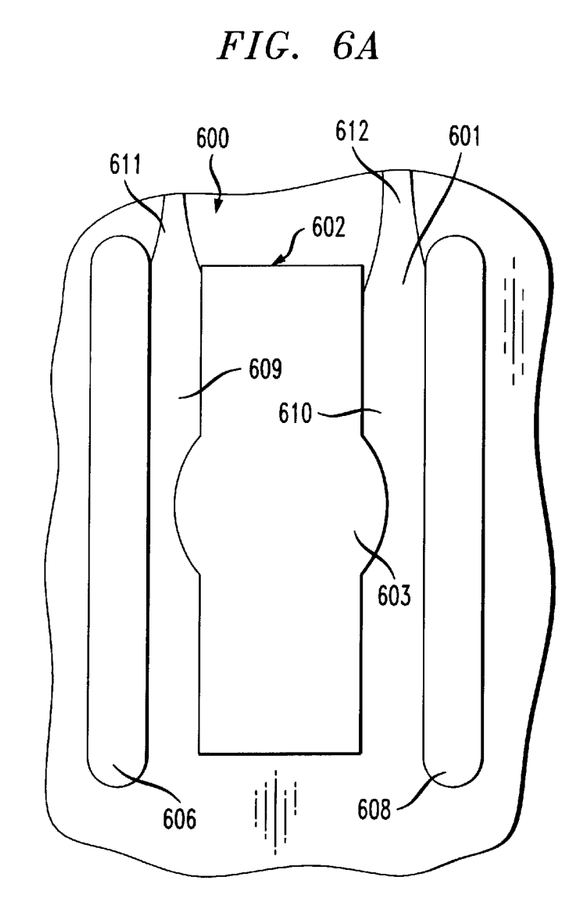
FIG. 6A is an enlarged detail of another alternative conductive pad that may be used in a further variation of the exemplary embodiment.
Figure 6B:
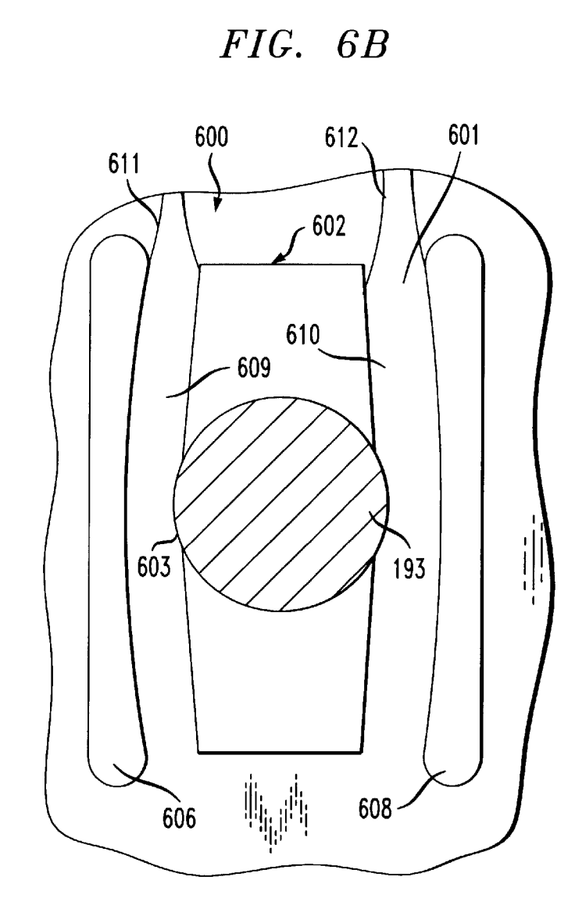
FIG. 6B shows a pin of a plug-in protector making electrical contact with the pad of FIG. 6A.

FIGS. 6A and 6B show a third exemplary connection 600 that may be used on the printed wiring board 300. The printed wiring board 300 has a plurality of holes 602. The holes 602 include a rounded middle portion 603 for receiving the tip 193 of the pin 191 of a plug-in protector. A pair of resilient elongated members 609, 610 is adjacent to each hole 602. The elongated members 609 and 610 are fixed at both ends. More specifically, in this example, the elongated members 609 and 610 are formed between the hole 602 and two slots 606 and 608. The slots 606 and 608 are symmetrically arranged on opposite sides of the hole 602.

The elongated members 609 and 610 have a conductive material 601 thereon. The conductive material 601 forms an electrical connection between the wirings 611, 612 and a pin 191 or electrode while the pin 191 or electrode is at least partially inserted into the hole 602. The elongated members 609, 610 deflect when the pin 191 or electrode is inserted into the hole 602.

FIG. 6B shows deflection of the elongated members 609, 610 when the tip 193 of pin 191 is inserted in the hole 502. As in the example of FIG. 4, the elongated members 609, 610 of FIG. 6B deflect elastically, without creep, and are capable of returning to their rest positions (FIG. 6A) if the pin 191 is removed.

Although the exemplary printed wiring board interface is used to connect a plurality of plug-in protectors to telecommunications equipment, the above-described printed wiring board may be used for connecting other types of devices in a plug and socket type interface. Thus, the above described printed wiring board structures are not limited to use in protector panels, but have a wide variety of applications.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A panel that receives plug-in modules,
   said panel having at least one pin receiving hole,
   said panel having a plurality of members depending therefrom, each of the at least one pin receiving hole having a respective pair of said members adjacent thereto and on respectively different sides thereof, each member having a boss at an end thereof, wherein each member has a rest position in which the member is bent towards a center of the pin receiving hole, and wherein each member has a gripping position in which the member is deflected away from the center of the pin receiving hole and towards a position parallel to the pin receiving hole to accommodate a pin inserted in that pin receiving hole.

2. The panel of claim 1, wherein the pin has a straight cylindrical surface, and the members are approximately parallel to a longitudinal axis of the pin receiving hole when the members are in the gripping position.

3. A protector panel, said panel having a plurality of pin receiving holes, said panel having a plurality of members depending therefrom, each one of the plurality of pin receiving holes having a respective pair of said members, each member having a boss at an end thereof, each pair of said members being shaped and positioned so as to grip a respective pin of a plug-in protector when the pin is inserted in the pin receiving hole, wherein each member has a rest position in which the member is bent towards a center of the pin receiving hole to which the member is adjacent, and wherein each member has a gripping position in which the member is deflected away from the center of the pin receiving hole to which the member is adjacent and towards a position parallel to the pin receiving hole to accommodate a pin inserted in that pin receiving hole.

4. The protector panel of claim 3, wherein each member has the boss at a lower end thereof.

5. The protector panel of claim 4, wherein each pin of the plug-in protector has a groove, the boss being received by the groove when the pin is inserted in one of the pin receiving holes.

6. The protector panel of claim 3, wherein the respective pair of members corresponding to each pin receiving hole are positioned on opposite sides of that pin receiving hole.

7. The protector panel of claim 3, wherein the pin has a straight cylindrical surface, and the members are approximately parallel to a longitudinal axis of the pin receiving hole when the members are in the gripping position.

8. The protector panel of claim 3, wherein:

the pins of the plug-in protector each have an approximately conical tip, and the pins of the plug-in protector can be supported above the bosses of the members of a plurality of holes in the panel, while the members are in the rest position.

9. The protector panel of claim 5, further comprising a printed wiring board beneath the plurality of members.

10. The protector panel of claim 9, wherein an electrical connection is formed between the wiring and a pin inserted in one of the pin receiving holes while the members adjacent to the one pin receiving hole are in the gripping position.

11. The protector panel of claim 3, wherein each boss is a rounded protuberance having a curved profile, the bosses projecting inwardly from lower ends of the members towards a center of each respective pin receiving hole.

12. The protector panel of claim 3, wherein each boss is a protuberance having a profile in the shape of a portion of a circle, ellipse, parabola or hyperbola.

13. An assembly comprising:

a panel having a plurality of pin receiving holes, and a plurality of members depending therefrom, each one of the plurality of pin receiving holes having a respective pair of said members, each member having a boss at a lower end thereof, each pair of said members being shaped and positioned so as to grip a respective pin of a plug-in protector when the pin is inserted in the pin receiving hole, wherein each member has a rest position in which the member is bent towards a center of the pin receiving hole to which the member is adjacent, and wherein each member has a gripping position in which the member is deflected away from the center of the pin receiving hole to which the member is adjacent and towards a position parallel to the pin receiving hole to accommodate a pin inserted in that pin receiving hole; and a printed wiring board attached to the panel, the printed wiring board having a printed wiring, the printed wiring having contacts aligned with the plurality of pin receiving holes, for forming electrical connections to the pins of the plug-in protector.

14. The assembly of claim 13, wherein the printed wiring board has a plurality of contact fingers, each contact finger aligned with a respective pin receiving hole, so as to contact a respective pin when that pin is inserted in that pin receiving hole.

15. The assembly of claim 14, wherein each contact finger is positioned between a respective hole in the printed wiring board and a channel adjacent to the respective hole in the printed wiring board.

16. The assembly of claim 15, wherein each contact finger is plated with solder.

17. The assembly of claim 14, further comprising a plurality of plug-in protectors, each plug-in protector having a plurality of pins, the pins having substantially the same lengths, the pins electrically contacting the printed wiring board simultaneously while the pins are inserted in the pin receiving holes.

\* \* \* \* \*